United States Patent [19]
Kawamura

[11] 3,946,257
[45] Mar. 23, 1976

[54] QUARTZ CRYSTAL VIBRATOR WITH PARTIAL ELECTRODES FOR HARMONIC SUPPRESSION

[75] Inventor: Yasukazu Kawamura, Funabashi, Japan

[73] Assignee: Kabushiki Kaisha Daini Seikosha, Japan

[22] Filed: Sept. 11, 1974

[21] Appl. No.: 504,992

[30] Foreign Application Priority Data
Sept. 17, 1973 Japan .................... 48-108574[U]

[52] U.S. Cl. .................. 310/9.6; 310/8.2; 310/8.5; 310/9.8
[51] Int. Cl.² ........................................ H01L 41/04
[58] Field of Search ............. 310/8.2, 8.3, 8.5, 8.6, 310/8.1, 9.7, 9.8; 58/23 TF, 23 U, 23 AC

[56] References Cited
UNITED STATES PATENTS

| | | | |
|---|---|---|---|
| 3,128,397 | 4/1964 | Shinada et al. | 310/9.8 X |
| 3,131,320 | 4/1964 | Shinada et al. | 310/9.7 X |
| 3,683,213 | 8/1972 | Staudte | 310/9.8 X |
| 3,697,766 | 10/1972 | Ganter | 310/8.2 |
| 3,697,789 | 10/1972 | Kato | 310/8.2 X |
| 3,766,616 | 10/1973 | Staudte | 310/8.2 X |

Primary Examiner—Mark O. Budd
Attorney, Agent, or Firm—Robert E. Burns; Emmanuel J. Lobato; Bruce L. Adams

[57] ABSTRACT

It is disclosed a quartz crystal vibrator for a timepiece having a partial electrode which is able to offset the charge produced by higher harmonic oscillation.

According to this invention, higher harmonic oscillation is prevented and vibrators oscillate by only fundamental frequency.

4 Claims, 7 Drawing Figures

QUARTZ CRYSTAL VIBRATOR WITH PARTIAL ELECTRODES FOR HARMONIC SUPPRESSION

BACKGROUND OF THE INVENTION

This invention relates to a quartz crystal vibrator for a timepiece which prevents its higher harmonic oscillation.

It is known that a quartz crystal vibrator has many higher harmonic vibrations. When it is incorporated into an oscillating circuit, it is apt to oscillate with unexpected higher harmonic oscillating frequency. For example, when the fundamental oscillating frequency is 32 KHZ, sometimes it is apt to oscillate about 190 KHZ, that is the frequency of approximately six times of the fundamental oscillating frequency.

For preventing this higher harmonic oscillation, an inductor, such as a coil, is disposed with it. However, since the internal space of a watch is extremely limited, it is impossible in this case.

SUMMARY OF THE INVENTION

It is therefore the object of the present invention to provide a quartz crystal vibrator which does not oscillate with higher harmonic frequency.

According to this invention, since vibrator has partial electrodes which are able to offset the charge produced by higher harmonic oscillations, they are prevented without giving any effect to the fundamental oscillation.

The nature, principle and details of the invention will be best understood by reference to the following description, taken in conjunction with the accompanying drawings.

DETAILED DESCRIPTION OF THE INVENTION

Figure 1:
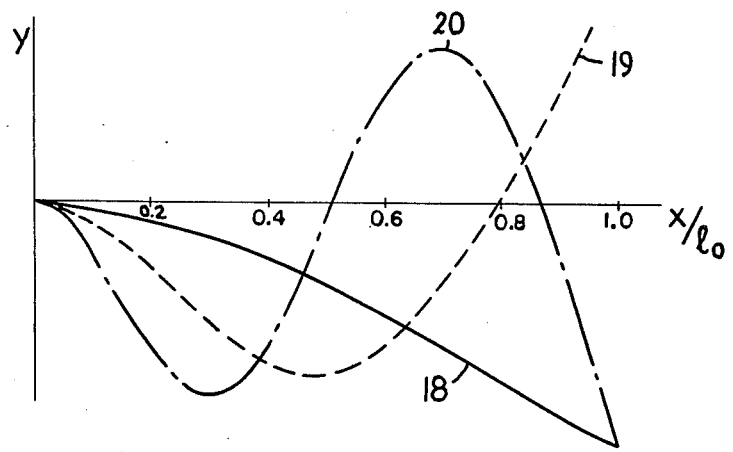
FIG. 1 shows oscillating mode of a tuning fork.

Referring now to the drawing, the principle of this invention is explained. The oscillating frequency of the vibrator is closely resembled by that of a cantilever vibrator and shown the formula as follows.

$$f = \frac{\alpha^2 n}{21.7} \cdot \frac{d}{l^2} \sqrt{\frac{E}{\rho}}$$

where
1: effective length of the tine,
d: width of the tine,
$\rho$: density of the vibrator,
E: Young's modulus,
$\alpha_n$: constant value which is defined by the boundary conditions,

| | |
|---|---|
| in case of the fundamental oscillation | 1.875 |
| the second harmonic oscillator | 4.694 |
| the third harmonic oscillation | 7.854 |

It is understood from above equation that the oscillating frequency of the second harmonic oscillation is about six times that of the fundamental oscillating frequency, and in case the third harmonic oscillation, it is almost seventeen times of the fundamental oscillating frequency.

Each oscillating mode is shown in FIG. 1, reference numeral 18 denotes the fundamental oscillating mode, numeral 19 denotes the second harmonic oscillating mode, and numeral 20 denotes the third harmonic oscillating mode. In this figure, an origin of co-ordinates is selected at the point of the root of the tine.

In a piezo electric oscillator such as quartz crystal, some value of charge in proportion to the strain of the tine is induced in the oscillator. That is to say, some value of charge in proportion to curvature of the tine is induced in case of bending mode oscillation.

It is understood from FIG. 1 that charge having same polarity is induced through the whole area in case of the fundamental oscillation, but if the sign of the curvature at the point of the root is plus, the sign of the curvature at the top of the tine is minus in case of the second harmonic oscillation. This means that the sign of induced charge is different.

If it is able to induce equivalent quantity of positive and negative charge on the electrode, total amount of induced charge becomes zero. Then the second harmonic oscillation may easily be prevented by offsetting the charge induced on electrodes which have the length to induce equivalent quantity of different polar charge on them respectively against the second harmonic oscillation.

The third harmonic oscillation may also be prevented in the same way as shown above. Then one tine offsets the charge produced against the second harmonic oscillation, the other tine offsets the charge produced against the third harmonic oscillation. This is shown in FIG. 2.

In this figure, the abscissa shows the ratio of the effective length of the tuning fork and the length of the electrode, the ordinate shows the conductance of the vibrator, and reference numeral 21 denotes the fundamental oscillation, numeral 22 denotes the second harmonic oscillation and numeral 23 denotes the third harmonic oscillation.

Figure 2:
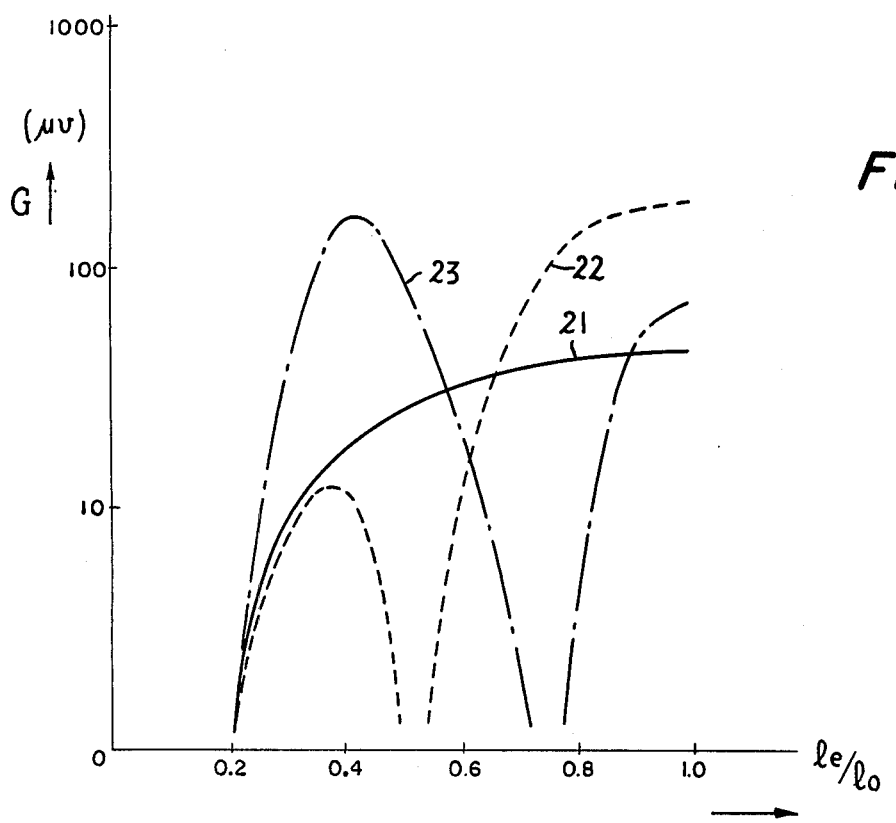
FIG. 2 is the graph explaining the principle of this invention.

It is understood from FIG. 2 that when the ratio of $l_e / l_o$ is about 0.5, the conductance of the second harmonic oscillation is very low. That is to say, the resistance of the vibrator is so high that it is not able to start oscillation.

Other higher harmonic oscillations exist theoretically in a tuning fork, however, they do not appear practically. Because characteristics of an amplifier is insufficient at such high frequencies. Then it is enough to consider about the second harmonic oscillation in practical use.

Figure 3:
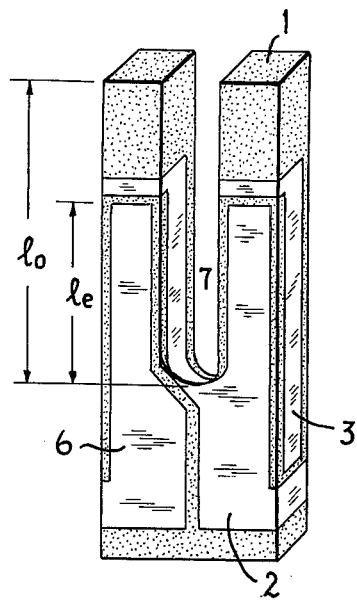
FIG. 3 is a perspective plane view of a tuning fork according to this invention.

Referring now to FIG. 3, it is shown a tuning fork 1 having the fundamental oscillating frequency of 32 KHZ of which plane angle is about five degrees against its X axis, and the direction of forks is almost along Y axis, further the direction of the thickness is towards Z axis. Electrodes 2-9 for oscillation are formed on surfaces of the tuning fork 1 by vacuum evaporation, spattering or etc.

Figure 4:
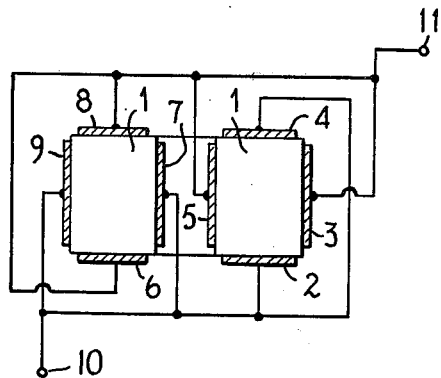
FIG. 4 shows the connection of electrodes which are made on the tuning fork shown in FIG. 1.

Each electrode is connected electrically shown in FIG. 4, and it is connected to external terminals 10 and 11. Each electrode is not connected with lead wires but connected with electrodes themselves.

In a conventional tuning fork made of quartz crystal, electrodes are formed to the top of tines, however, according to this invention, electrodes are not formed until the top of tines shown in FIG. 3. It is preferable for each electrode to satisfy the following conditions:

$$l_e / l_o = 0.5 \sim 0.8$$

where $l_e$ is the effective length of an electrode, and $l_o$ is the length of a tine. Then each electrode is a partial electrode.

Figure 5:
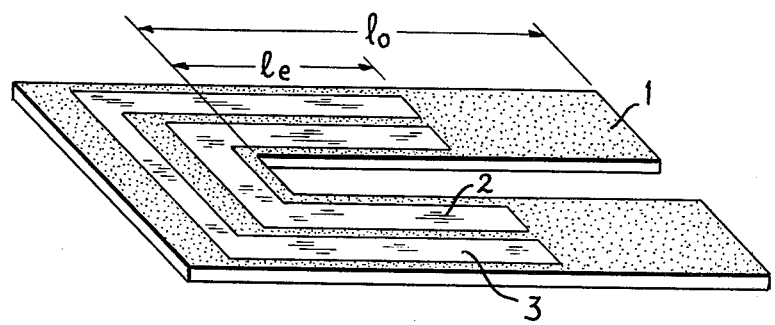
FIG. 5 is a perspective plane view of a tuning fork made of thin quartz plate according to this invention.
Figure 6:
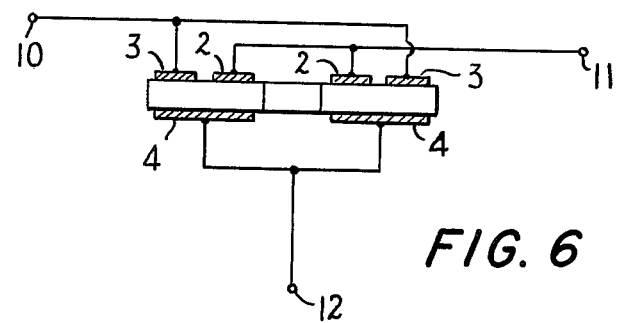
FIG. 6 shows the connection of electrodes which are made on the tuning fork shown in FIG. 3.

FIG. 5 shows a tuning fork made of a thin quartz crystal plate of NT cut applying above way of thinking. The connection of electrodes are shown in FIG. 6 and reference numerals 11 and 12 denote external terminals. Electrodes 2 and 3 are partial electrodes satisfying with the condition of $l_e / l_o = 0.5 \sim 0.8$.

Modifications may be made, for example, such partial electrodes are applicable to a free-free-bar type vibrator or other vibrators.

Figure 7:
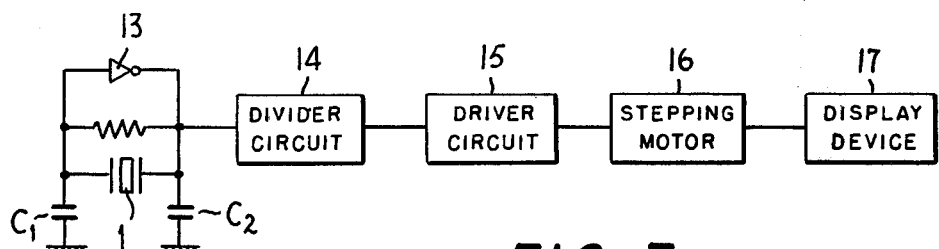
FIG. 7 is a schematic diagram showing the construction of a timepiece.

FIG. 7 shows the construction of a timepiece schematically and known Colpitts oscillator circuit is used therein. The vibrator 1 is connected between the output terminal and the input terminal, and the condensers $C_1$ and $C_2$ are connected respectively between these terminals and earth terminal. Fine adjustment of the oscillating frequency may easily be done changing capacitance of these condensers.

The output signals from the oscillator circuit is transmitted to a display device 17 via a divider circuit 14, a driver circuit 15 and a stepping motor 16.

According to the invention, analogical display is carried out, however, digital display may easily be done replacing the stepping motor 16 by a matrix circuit, and replacing display device 17 by light emitting diodes or liquid crystal display device.

While a preferred embodiment of the invention has been shown and described it will be understood that many modifications and changes can be made within the true spirit and scope of the invention.

I claim:

1. A resonator comprising, a tuning fork made of a piezoelectric material having tines, each tine having partial electrodes on opposite sides thereof, electrical paths formed on the tuning fork electrically pairing the electrodes on the tines, each partial electrode having a partial length on the effective length of the corresponding tine less than the effective length of the corresponding tine, the effective length of each tine corresponding to the length of the portion thereof from the root to the outermost tip thereof, the ratio of the partial length of each electrode to the effective length of a corresponding tine being chosen at a value such that the relationship therebetween is effective to cancel in the corresponding tine the induced field due to deformation corresponding to second and higher harmonic oscillations, whereby each corresponding tine oscillates substantially only at a desired fundamental frequency.

2. A resonator according to claim 1, in which said ratio is in the order of 0.5.

3. A resonator according to claim 1, in which said ratio is from about 0.5 to about 0.8.

4. A resonator according to claim 1, in which said piezoelectric material is quartz crystal.

* * * * *